(12) United States Patent
Välimäki et al.

(10) Patent No.: US 10,763,435 B2
(45) Date of Patent: Sep. 1, 2020

(54) LAYERED APPARATUS AND ITS MANUFACTURING METHOD

(71) Applicant: TEKNOLOGIAN TUTKIMUSKESKUS VTT OY, Espoo (FI)

(72) Inventors: Marja Välimäki, Oulu (FI); Tapio Ritvonen, Oulu (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 0 days.

(21) Appl. No.: 16/332,915

(22) PCT Filed: Sep. 26, 2017

(86) PCT No.: PCT/FI2017/050673
§ 371 (c)(1),
(2) Date: Mar. 13, 2019

(87) PCT Pub. No.: WO2018/060555
PCT Pub. Date: Apr. 5, 2018

(65) Prior Publication Data
US 2019/0237670 A1    Aug. 1, 2019

(30) Foreign Application Priority Data

Sep. 27, 2016 (FI) .................................. 20165725

(51) Int. Cl.
*H01L 51/44* (2006.01)
*H01L 51/52* (2006.01)
*H01L 51/00* (2006.01)

(52) U.S. Cl.
CPC ...... *H01L 51/0022* (2013.01); *H01L 51/0097* (2013.01); *H01L 51/441* (2013.01); *H01L 51/5203* (2013.01); *Y02E 10/549* (2013.01)

(58) Field of Classification Search
CPC ............. H01L 51/0022; H01L 51/0097; H01L 51/441; H01L 51/5203; Y02E 10/549
(Continued)

(56) References Cited

U.S. PATENT DOCUMENTS 9,692,005 B2* 6/2017 Wehlus ............... H01L 51/5212
2005/0270464 A1* 12/2005 Seo ...................... H01L 51/5253
349/139
(Continued)

FOREIGN PATENT DOCUMENTS

DE    10 2007 004 509    5/2008
DE    10 2012 221 191    5/2014
(Continued)

OTHER PUBLICATIONS

WO20111661608 (A1) Dec. 29, 2011 Inventor/Applicant (for US only) Schwab. Holger Dec. 29, 2011.*
(Continued)

*Primary Examiner* — Long K Tran
(74) *Attorney, Agent, or Firm* — Nixon & Vanderhye P.C.

(57) ABSTRACT

A layered apparatus comprises a substrate (100), a first electrically conductive layer (102) on and in contact with the substrate (100), a second patterned electrically conductive layer (104) which is in contact with the first electrically conductive layer (102), a third electrically conductive layer (112), a fourth electrically conductive layer (114) which is electrically insulated from the first electrically conductive layer (102), the second patterned electrically conductive layer (104) and the third electrically conductive layer (112), and an operationally active layer (108) between the first electrically conductive layer (102) and the fourth electrically conductive layer (114). The second patterned electrically conductive layer (104) is thicker than the operationally active layer (108), and a top part (104A) of the second
(Continued)

patterned electrically conductive layer (104) extends across the operationally active layer (108) for having an electrical contact with the third electrically conductive layer (112).

8 Claims, 3 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2007/0186971 | A1 | 8/2007 | Lochun et al. |
| 2011/0198622 | A1* | 8/2011 | Amelung ............ H01L 27/3204 257/88 |
| 2011/0198657 | A1 | 8/2011 | Lang et al. |
| 2011/0240119 | A1* | 10/2011 | Lee ................. H01L 31/022425 136/256 |
| 2015/0318512 | A1 | 11/2015 | Wehlus |
| 2017/0263882 | A1 | 9/2017 | Wehlus |

FOREIGN PATENT DOCUMENTS

| | | |
|---|---|---|
| EP | 2 202 819 | 6/2010 |
| EP | 2 657 979 | 10/2013 |
| FR | 3 017 997 | 8/2015 |
| WO | 2007/106756 | 9/2007 |
| WO | 2011/161608 | 12/2011 |
| WO | 2013/140549 | 9/2013 |

OTHER PUBLICATIONS

International Search Report for PCT/FI2017/050673, dated Dec. 15, 2017, 3 page.
Written Opinion of the ISA for PCT/FI2017/050673, dated Dec. 15, 2017, 10 pages.
Search Report for FI20165725 dated May 4, 2017, 2 pages.
Office Action for FI20165725 dated May 7, 2018, 9 pages.
Tseng, "Scaling of Inkjet-Printed Transistors using Novel Printing Techniques", http://digitalassets.lib.berkeley.edu/techreports/ucb/text/eecs-2011-146.pdf , Technical Report No. UCB/EECS-2011-146, Dec. 16, 2011, 121 pages.
Välimäki et al., "R2R-printed inverted OPV modules—towards arbitrary patterned designs", Nancoscale, Royal Society of Chemistry, 2015, 7, pp. 9570-9580.

* cited by examiner

LAYERED APPARATUS AND ITS MANUFACTURING METHOD

This application is the U.S. national phase of International Application No. PCT/FI2017/050673 filed 26 Sep. 2017, which designated the U.S. and claims priority to FI Patent Application No. 20165725 filed Sep. 27, 2016, the entire contents of each of which are hereby incorporated by reference.

FIELD

The invention relates to a layered apparatus and its manufacturing method.

BACKGROUND

Thin film photovoltaics (PVs), organic PVs (OPVs) and organic light emitting diodes (OLEDs) have been fabricated by using various roll-to-roll (R2R) compatible printing and coating techniques. The structures have been printed usually in a form of stripes. However, the use of transparent or semi-transparent material limits the ability to align the printed layer in register. Furthermore, the rheological properties of some interlayer materials are quite different from the specifications determined by mechanical printing methods (namely gravure printing, flexography printing, screen printing, offset printing, pad printing, ink-jet printing, aerosol jet printing or the like) and the sufficient dimensional accuracy is challenging to obtain. There have been efforts to produce registration marks that could be detected by the registration camera for the custom-shaped (arbitrary) structures with OPV. However, that has not been a satisfying method.

Hence, there is a need to improve the structure and a manufacturing method of the structure.

BRIEF DESCRIPTION

The present invention seeks to provide an improvement in the apparatus. According to an aspect of the present invention, there is provided a layered apparatus.

According to another aspect of the present invention, there is provided a method of manufacturing a layered apparatus.

The invention has advantages. The fabrication of patterned structures using a fully-covered thin film layer(s) and thicker, printed busbar electrode for operational contacting facilitates aligning problems related to the prior art without decreasing the electrical performance and visual appearance of the device. Materials which are invisible to the registration camera may be used.

LIST OF DRAWINGS

Example embodiments of the present invention are described below, by way of example only, with reference to the accompanying drawings, in which FIG. 1A illustrates an example of a layered apparatus viewed from a side;

DESCRIPTION OF EMBODIMENTS

The following embodiments are only examples. Although the specification may refer to "an" embodiment in several locations, this does not necessarily mean that each such reference is to the same embodiment(s), or that the feature only applies to a single embodiment. Single features of different embodiments may also be combined to provide other embodiments.

Furthermore, words "comprising" and "including" should be understood as not limiting the described embodiments to consist of only those features that have been mentioned and such embodiments may contain also features/structures that have not been specifically mentioned.

It should be noted that while Figures illustrate various embodiments, they are simplified diagrams that only show some structures and/or functional entities. The connections shown in the Figures may refer to logical or physical connections. It is apparent to a person skilled in the art that the described apparatus may also comprise other functions and structures than those described in Figures and text. It should be appreciated that details of some functions or structures are irrelevant to the actual invention. Therefore, they need not be discussed in more detail here.

The use of coating methods limits the ability to directly pattern arbitrary, custom-shaped two-dimensional (2D) features which is considered to be a key factor for the successful commercialization especially with OPVs as recently recognized by many commercial players. In effect, customization is the key advantage of using printing over coating thus unlimited designs to any 2D shape is possible, giving true design freedom. However, the transparent/semi-transparent materials are difficult to align with the printed layer. The rheological properties of some materials may be different from the specifications determined by mechanical printing methods such as gravure printing, flexography printing, screen printing, offset printing, pad printing, ink-jet printing, aerosol jet printing or the like, which results in variations with the dimensional accuracy. In this application, a layer which is patterned may refer to a patterned transfer of material on a surface which directly results in a patterned layer, or a material which is first transferred on a surface in a non-patterned form and which is separately patterned by etching or the like, for example. A non-patterned layer, in turn, covers the entire layer on which the non-patterned layer is formed.

Figure 1A:
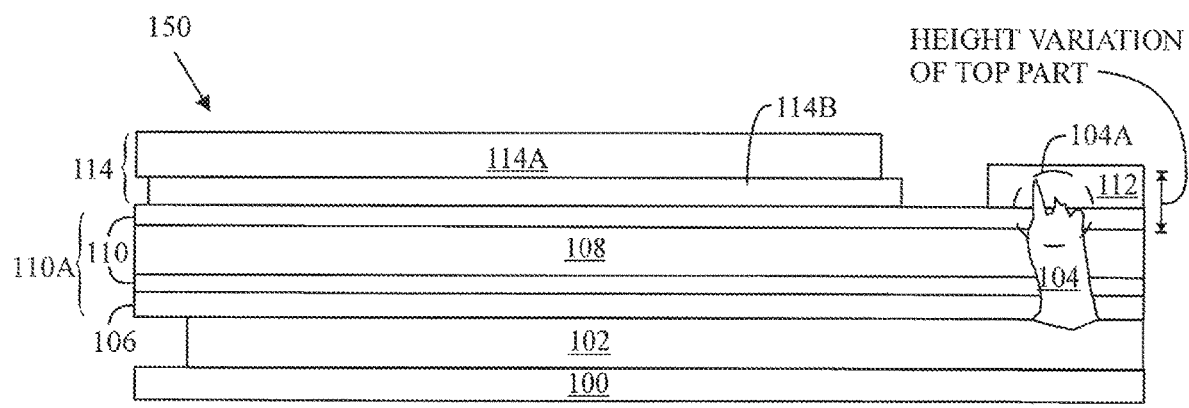
FIG. 1B illustrates an example of a layered apparatus viewed from above.

The new layered structure 150 an example of which is illustrated in FIG. 1A comprises an active layer structure 110A between a first electrically conductive layer 102 and a fourth electrically conductive layer 114. The active layer structure 110A comprises at least an active layer 108. At least one interlayer 110 and a non-patterned electrically non-conducting layer 106 of the active layer structure 110A are optional. The operationally active layer structure 110A that is between the first electrically conductive layer 102 and the fourth electrically conductive layer 114 comprises at least one non-patterned layer, the at least one non-patterned layer in the active layer structure 110A being the non-patterned electrically non-conducting layer 106, the active layer 108 or an interlayer 110. A thickness of the active layer structure 110A may typically be less than 1 μm.

The first electrically conductive layer 102 is on a substrate 100 for giving support and strength to the apparatus 150. A second patterned electrically conductive layer 104, which may be thicker than any other layer alone and which has electric contact with the first electrically conductive layer 102, extends across the active layer structure 110A and has an electric contact with a third electrically conductive layer 112. That it extends across the active layer structure 110A results from its thickness with respect to other layers.

The second patterned electrically conductive layer 104 may be thicker than one or more non-patterned layers of the operationally active layer structure 110A. Namely, the one or more non-patterned layers are located on or above the second patterned electrically conductive layer 104 layer, but as the second patterned electrically conductive layer 104 is thicker, it extends across and also through the one or more non-patterned layers of the active layer structure 110A. One or more patterned layers of the operationally active layer structure 110A are, in turn, considered so patterned that they do not located on or above the second patterned electrically conductive layer 104, but instead the second patterned electrically conductive layer 104 is beside or between sections of the patterned layers of the operationally active layer structure 110A.

The third electrically conductive layer 112, in turn, may be electrically insulated from the fourth electrically conductive layer 114. In an embodiment, the third electrically conductive layer 112 and the fourth electrically conductive layer 114 may be in electrical contact with each other. The electric contact may be considered at least about the same as a galvanic contact i.e. the contact is electrically conductive.

In more detail, the layered apparatus 150 comprises a substrate 100, and the first electrically conductive layer 102 is on and in contact with the substrate 100. In an embodiment, the first electrically conductive layer 102 may be non-patterned which requires an insulating layer (not shown in Figures) between the first electrically conductive layer 102 and the active layer structure 110A or the active layer 108. In an embodiment, the first electrically conductive layer 102 may be patterned. The second patterned electrically conductive layer 104 is in contact with the first electrically conductive layer 102. The second patterned electrically conductive layer 104 may also be called a busbar. The third electrically conductive layer 112 and the fourth electrically conductive layer 114 are on the opposite side of the layered apparatus 150 with respect to the substrate 100. The fourth electrically conductive layer 114 is electrically insulated from the first electrically conductive layer 102, the second patterned electrically conductive layer 104 and the third electrically conductive layer 112. An operationally active layer structure 110A is between the first electrically conductive layer 102 and the fourth electrically conductive layer 114.

The second patterned electrically conductive layer 104 is thicker than the operationally active layer structure 110A. Thus, a top part 104A of the second patterned electrically conductive layer 104 extends across the operationally active layer structure 110A for having an electrical contact with the third electrically conductive layer 112. Thus, the top part 104A of the second patterned electrically conductive layer 104 may pass through or pierce the electrically non-conducting layer 106 and the operationally active layer structure 110A.

The substrate 100 may be flexible. The substrate 100 may be transparent in visible light. The visible light is electromagnetic radiation the wavelengths of which range about 390 nm to 700 nm. The substrate 100 may be thinner than about 1 mm. Material of the substrate 100 may be a polymer like plastic or glass. The material of the substrate 100 may comprise polyethylene terephthalate (PET) or flexible glass, for example.

The first electrically conductive layer 102 may at least partially cover the substrate 100. Material of the first electrically conductive layer 102 may comprise indium tin oxide (ITO), fluorine doped tin oxide (PTO), and/or doped zinc oxide, graphene, carbon nanotubes, nano size conductive ink (for example silver, copper), nano silver wires, PEDOT:PSS (Poly(3,4-EthyleneDiOxyThiophene) PolyStyrene Sulfonate). At least one or both of the electrodes is electrically conductive and transparent in visible light.

The non-conducting layer 106 is often thin (thinner than 30 nm) and made of material (ZnO, doped-ZnO, TiOx or polymer, for example) which is transparent. That is why it is not visible to the registration camera which is used for aligning the layers to each other. If the first electrically conductive layer 102 is transparent, an at least partly transparent grid-structure may be used for the second electrically conductive layer 104 which may be used with PEDOT:PSS. The substrate 100 with the first electrically conductive layer 102 may be flexible and suitable for a roll-to-roll printing process.

The contact between the first electrically conductive layer 102 and the second patterned electrically conductive layer 104 is an electric contact. The second patterned electrically conductive layer 104 is on the first electrically conductive layer 102. The second patterned electrically conductive layer 104 may penetrate the first electrically conductive layer 102 and be in contact with the substrate 100. The second patterned electrically conductive layer 104 may be differently patterned than the first electrically conductive layer 102 if the first electrically conductive layer 102 is patterned. The first electrically conductive layer 102 may be non-patterned if the non-conducting layer 106 and/or some other layer between the first electrically conductive layer 102 and the active layer structure 110A is an insulating layer. The second patterned electrically conductive layer 104 is patterned although the first electrically conductive layer 102 may be non-patterned. The second patterned electrically conductive layer 104 may be made of silver paste, for example. In general, material of the second patterned electrically conductive layer 104, which is liquid-like, is transferred on the substrate 100 with or without the first electrically conductive layer 102 in a wet-process. In this application, the transfer of the liquid-like material of the second patterned electrically conductive layer 104 on the substrate 100 or the first electrically conductive layer 102 is considered printing. The second patterned electrically conductive layer 104 may thus be printed using gravure printing, flexography printing and/or screen printing, for example. Printing enables a thick layer which can extend through other layer(s). Printing also results in a directly patterned electrically conductive layer 104 which doesn't require further patterning. In this manner, automated camera registration may be used for the layer alignment to the first electrically conductive layer 102 on the basis of the second patterned electrically conductive layer 104 which is not transparent and which is visible to the registration camera. The second electrically conductive layer 104 may have a grid-structure in order to be transparent. In a similar manner, the fourth electrically conductive layer 114A may have a grid-structure for allowing light pass through, and the fourth electrically conductive layer 114B may be made of patterned PEDOT:PSS, for example. The non-conductive layer 106, in turn, is visibly transparent or highly transparent. The first electrically conductive layer 102 may be directed to a desired location with the second patterned electrically conductive layer 104 which is why both of them may need to be detectable by the registration camera.

As can be seen in FIG. 1A, for example, the third electrically conductive layer 112 is above the second patterned electrically conductive layer 104 which may be non-transparent. Thus, the third electrically conductive layer 112 prevents visual observation of the second patterned electrically conductive layer 104 from above of the apparatus. That is why the apparatus 150 appears neat for a person looking at it.

In an embodiment, a maximum thickness of the second patterned electrically conductive layer 104 may range between about 0.1 µm and 20 µm, for example. In an embodiment, a thickness of the non-patterned electrically non-conducting layer 106 may range between 1 nm and 100 nm. Also a thickness of the interlayer 110 may range 1 nm to 100 nm. Material of the non-patterned electrically non-conducting layer 106 may comprise zinc oxide (ZnO), doped-ZnO, TiOx, SnO, and polymers such as electrically low conductive PEDOT:PSS (electrically non-conducting PEDOT:PSS), PEIE (PolyEthylenlmine Ethoxylated) or PEI (PolyEthylenlmine) or amino acids or their derivates. In this case the zinc oxide is non-doped or very lightly doped in order to keep it electrically insulating. The non-patterned electrically non-conducting layer 106 may have a full coverage on the second electrically conductive layer 102 which means that the non-patterned electrically non-conducting layer 106 is not patterned and the non-patterned electrically non-conducting layer 106 covers the first patterned electrically conductive layer 102 entirely. Because the non-patterned electrically non-conducting layer 106 is not patterned and has full coverage, it doesn't require camera registration for its application. The non-patterned electrically non-conducting layer 106 may be made by using printing or coating methods. The non-patterned electrically non-conducting layer 106 may be made by gravure printing, flexography printing, screen printing, reverse gravure printing, slot-die coating or the like, for example.

In this application, the non-conducting layer 106 refers to a layer that reduces or prevents the transfer of electric current. The non-conducting layer 106 reduces or prevents the flow of DC electric current. The non-conducting layer 106 reduces or prevents the transfer of electric current in the lateral direction i.e. in the direction perpendicular to the normal of the non-conducting layer 106. The non-conducting layer 106 reduces or prevents movement of charge carriers such as electrons and/or holes. The non-conduction as such means that the transfer of electric current is reduced or blocked. The non-conducting layer 106 may discharge static electricity in the apparatus 150 and between the layers. In an embodiment, the non-conducting layer 106 may cover continuously the active layer structure 110A entirely. Additionally or alternatively, the active layer 108 may discharge static electricity in the apparatus 150 and between the layers.

In an embodiment, the active layer structure 110A may comprise at least one interlayer 110 which may be patterned or non-patterned. The interlayer 110 may discharge static electricity in the apparatus 150 and between the layers. The height variation at the top part 104A of the second patterned electrically conductive layer 104 may be larger than the maximum thickness of one of the at least one interlayer 110. The height variation at the top part 104A of the second patterned electrically conductive layer 104 may be larger than the thickness of the active layer 108, the at least one interlayer 110, the non-patterned electrically non-conducting layer 106 alone or any combination thereof. The height variation at the top part 104A of the second patterned electrically conductive layer 104 may be larger than the maximum thickness of the active layer 108. The height variation at the top part 104A of the second patterned electrically conductive layer 104 may be larger than a thickness of the non-patterned electrically non-conducting layer 106. The height variation at the top part 104A of the second patterned electrically conductive layer 104 may be larger than a thickness of one interlayer 110. The height variation at the top part 104A of the second patterned electrically conductive layer 104 may be larger than a thickness of the at least one interlayer 110, the non-patterned electrically non-conducting layer 106 and the thickness of the active layer 108 together.

A layer that may discharge static electricity may extend in one dimension or in a one-dimensional shape, like a narrow stripe straight or curved, over the apparatus or the substrate 100. During manufacturing, a layer that may discharge static electricity may extend in one dimension over the substrate 100 in machine direction in a roll-to-roll process, for example. The discharge of static electricity is also possible when the layer that may discharge static electricity is non-patterned. The layer that may discharge static electricity may be electrically connected to an electrically conductive structure that is separate from the apparatus or substrate 100 at an edge of the substrate 100. The electrically conductive structure that is separate from the apparatus or the substrate 100 may be a part of the environment.

Because of printing, the surface roughness of the second patterned electrically conductive layer 104 may result in the height variation larger than the maximum thickness of one of the at least one interlayer 110. Two interlayers 110 may be arranged such that one interlayer 110 is on one side of the active layer 108 and another interlayer 110 is on other side of the active layer 108. That is, the active layer 108 may be sandwiched between two interlayers 110 in order to have the active layer structure 110A. The interlayer 110 may be printed. The two interlayers 110 on opposite sides of the active layer structure 110A may be of the same material or different materials.

The interlayer 110 may comprise a layer made of metal oxide such as $MoO_3$ (molybdenum oxide), $V_2O_5$ (vanadium oxide), $WO_3$ (tungsten oxide), ZnO (zinc oxide), TiOx (titanium oxide), SnO (tin oxide) or fullerenes, or polymers such as low conductive grade of PEDOT:PSS, polyethylenimine (PEI), polyethylenimine ethoxylate (PEIE), poly [(9, 9-bis (3'-(N,N-dimethylamino)propyl)-2,7-fluorene)-alt-2, 7-(9,9-dioctylfluorene)] (PFN) or amino acids and their derivates. The use of material may depend on selectivity to the holes/electrons. For example, tungsten trioxide ($WO_3$), $MoO_3$, $V_2O_5$ or PEDOT:PSS may be used because of its selectivity to the holes. On the other hand, ZnO, TiOx, fullerenes, PEIE, PEI or PFN are used because of their selectivity to electrons. The non-patterned electrically non-conducting layer 106 and the interlayer 110 may also comprise a combination of metal oxide and polymer/amino acids or their derivatives. The material of the interlayer 110 may be different on different sides of the active layer 108. However, the at least one interlayer 110 is not necessary in all possible layered apparatuses 150. Similarly, the non-conducting layer 106 is not necessary in all possible layered apparatuses 150.

In an embodiment, the interlayer 110 may have a lower electrical conductivity than the patterned electrically conductive layer 104. In an embodiment, the interlayer 110 may cover continuously and entirely the active layer 108. That is, the interlayer 110 may be non-patterned.

In an embodiment, the second patterned electrically conductive layer 104 may be printed for having a desired height variation at the top part 104A. In an embodiment, the second patterned electrically conductive layer 104 may be etched for having a desired height variation at the top part 104A. In an embodiment, the second electrically conductive layer 102 may be made by etching.

In an embodiment, the apparatus comprises a non-patterned electrically non-conducting layer 106 between the first electrically conducting layer 102 and the active layer 108. Then the active layer structure 110A comprises the non-patterned electrically non-conducting layer 106. The non-conducting layer 106 may be an insulator or a thin layer of ZnO, TiOx, SnOx (tin oxide) or the like. The top part 104A of the second patterned electrically conductive layer 104 may penetrate the non-patterned electrically non-conducting layer 106. In other words, the top part 104A of the second patterned electrically conductive layer 104 passes through or pierces the active layer 108 and the non-patterned electrically non-conducting layer 106.

In an embodiment, the active layer 108 may comprise a layer made of poly(3-hexylthiophene):[6,6]-phenyl C61 butyric acid methyl ester (P3HT:PCBM), for example. The active layer 108 may be printed. A thickness of the active layer 108 may range 50 nm to 500 nm. The printing method may be gravure printing. The apparatus may be an organic solar cell, for example, without limiting to that.

In an embodiment, the active layer 108 and/or the active layer structure 110A may have a lower electrical conductivity than the second patterned electrically conductive layer 104. In an embodiment, the active layer 108 may have a full coverage on the lower interlayer 110, on the non-conducting layer 106 or on the first electrically conductive layer 102. That is, the active layer 108 may cover continuously the area of the entire first electrically conductive layer 102 and thus the active layer 108 may be non-patterned. In another embodiment, the active layer 108 may be patterned. Camera registration may or may not be used for the layer alignment when the active layer 108 or the active layer structure 110A is formed. The interlayer 110, in turn, may or may not have a full coverage on the active layer 108. The active layer 108 and the interlayer 110 have a low electrical conductivity which is between electrical conductivity of an electrical conductor and electrical conductivity of an electrical insulator.

In an embodiment, the fourth electrically conductive layer 114 may comprise two electrically conductive sublayers 114A, 114B. The electrically conductive sublayer 114A may be of similar material to the first electrically conductive layer 102 or the second electrically conductive layer 104. At least one of the fourth electrically conductive layer 114 and the first electrically conductive layer 102 is transparent. If the first electrically conductive layer 102 is not transparent, the fourth electrically conductive layer 114 is required to be transparent as material or a grid. Material of the fourth electrically conductive layer 114 may be indium tin oxide (ITO), fluorine doped tin oxide (PTO), and/or doped zinc oxide, graphene, carbon nanotubes, silver nanotubes, nano size conductive ink (for example silver, copper), nano silver wires, PEDOT:PSS (Poly(3,4-EthyleneDiOxyThiophene) PolyStyrene Sulfonate), for example. In an embodiment, the fourth electrically conductive layer 114 may be made from silver paste. In an embodiment, the fourth electrically conductive layer 114 may be made by a rotary screen printing method or a flexography printing which maintains good dimensional accuracy. Automated camera registration may be used for the layer alignment when the fourth electrically conductive layer 114 is formed.

In an embodiment, the fourth electrically conductive layer 114A may be made from silver paste or nano silver wires, for example. In an embodiment, the fourth electrically conductive layer 114A may be made by a rotary screen printing method or a flexography printing which maintains good dimensional accuracy. Automated camera registration may be used for the layer alignment when the fourth electrically conductive layer 114A is formed.

Figure 1B:
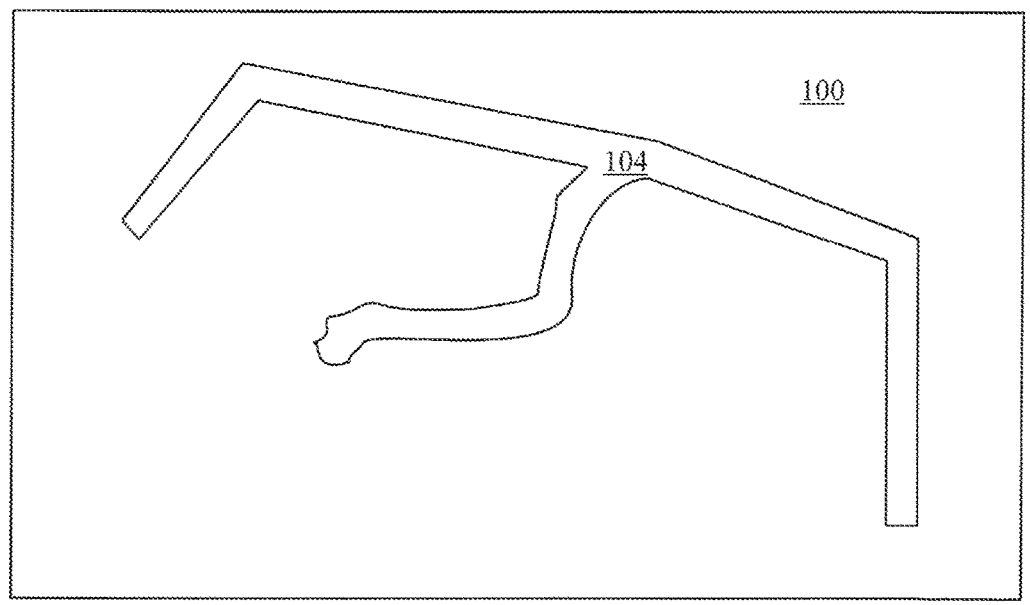

FIG. 1B illustrates an example of the second patterned electrically conductive layer 104 viewed from above. Only the substrate 100 and the second patterned electrically conductive layer 104 are shown in FIG. 1B for simplicity. As can be seen, the shape of the second patterned electrically conductive layer 104 may have a free form or a free shape. The second patterned electrically conductive layer 104 may have a shape of a strip or a band the thickness of which is larger than at least one of the layers of the layered structure. The second patterned electrically conductive layer 104 may have at least one round edge and/or at least one sharp edge with a sharp angle. The width of the second patterned electrically conductive layer 104 may be constant or it may vary in the longitudinal direction. The second patterned electrically conductive layer 104 may have branches or it may be branchless. In this manner, the second patterned electrically conductive layer 104 forms a three-dimensional structure. Additionally, there may be a plurality of the second patterned electrically conductive layers 104 on one substrate 100 (FIG. 1B shows only one second patterned electrically conductive layer 104).

Figure 2A:
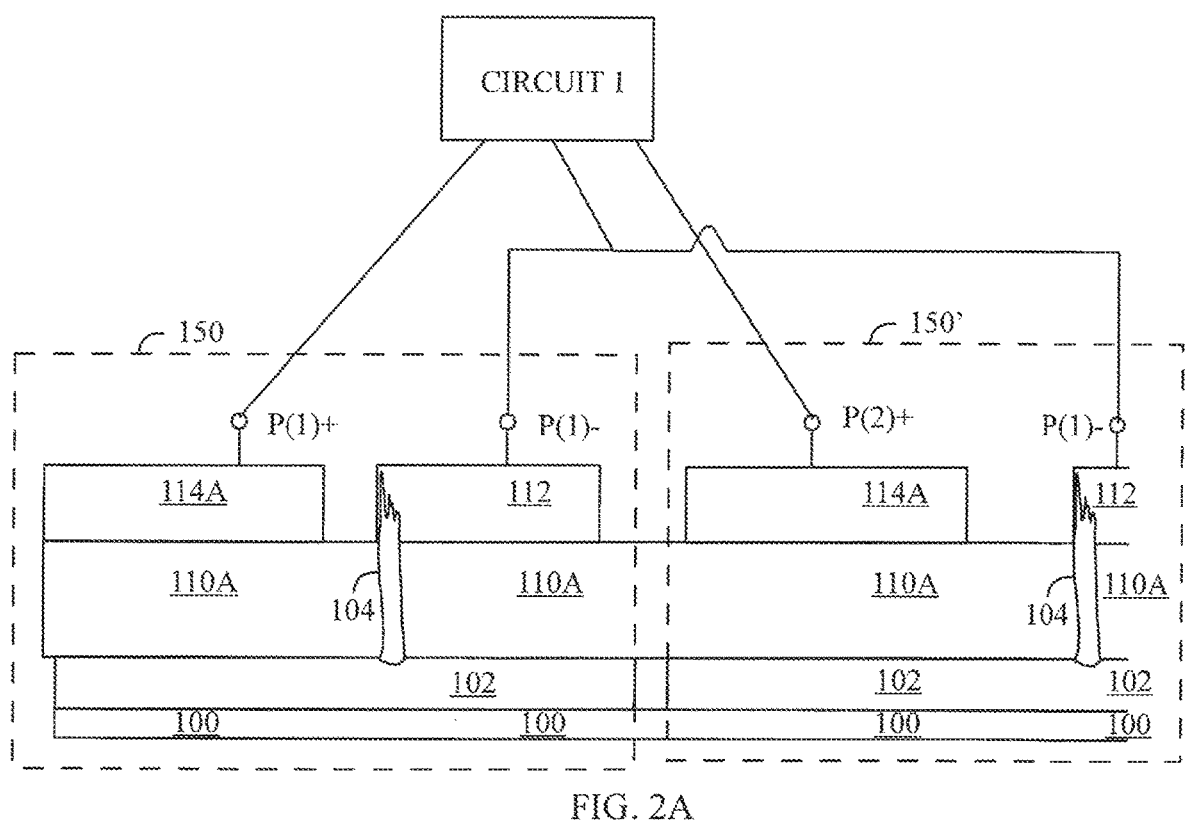
FIG. 2A illustrates an example of a plurality of layered apparatuses on one substrate coupled with a common electric circuit.
Figure 2B:
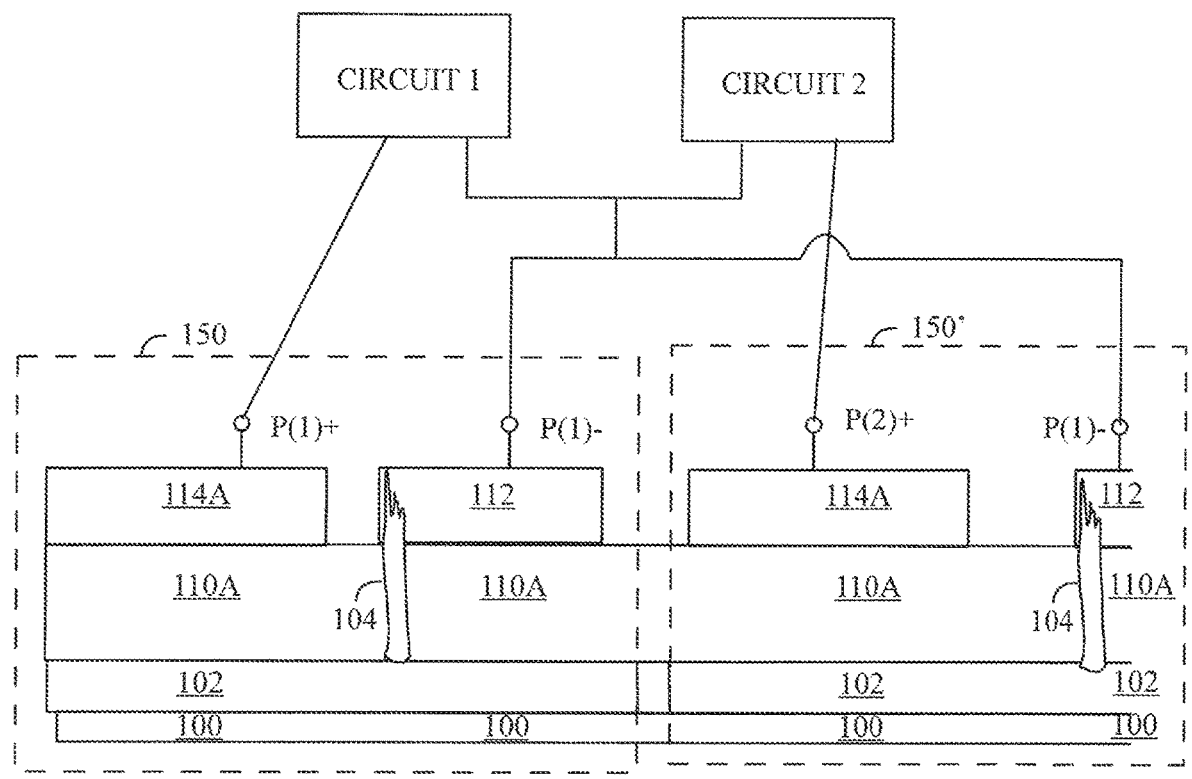
FIG. 2B illustrates an example of a plurality of layered apparatuses on one substrate coupled with different electric circuits.

FIGS. 2A and 2B illustrate examples where there are more than one apparatus 150, 150' on one substrate 100. The layered structure, per se, is the same or similar to that in FIGS. 1A and 1B. Different apparatuses 150, 150' may have poles P(1)+, P(1)− and P(2)+ which form different contact electrode pairs P(1)+, P(1)− and P(2)+. The poles P(1)+, P(1)− and P(2)+ may be inputs or outputs of electric signals. The contact electrode P(1)− may be common, and it may be coupled to ground, for example. In FIG. 2A the poles P(1)+, P(1)− and P(2)+ are coupled to one electric circuit CIRCUIT 1. In such a case, both apparatuses 150, 150' operate in a similar manner. That is, both apparatuses 150, 150' input a signal to CIRCUIT 1 or both receive a signal from CIRCUIT 1. Note that the first electrically conductive layer 102 is discontinuous between poles P(1) and P(2). The discontinuity results in electrical insulation.

In FIG. 2B, the poles P(1)+ and P(2)+ may be coupled to different electric circuits, CIRCUIT 1, CIRCUIT 2. In this case, both apparatuses 150, 150' may operate in a different manner. That is, the apparatus 150 may input a signal to CIRCUIT 1 and the apparatus 150' may then be inactive. The apparatus 150' may input a signal to CIRCUIT 2 and the apparatus 150 may then be inactive. The apparatus 150 may input signal to CIRCUIT 1 and the apparatus 150' may input a signal to CIRCUIT 2. Alternatively, the apparatus 150 may receive a signal from CIRCUIT 1 and the apparatus 150' may then be inactive. The apparatus 150' may receive a signal from CIRCUIT 2 and the apparatus 150 may then be inactive. The apparatus 150 may receive signal from CIRCUIT 1 and the apparatus 150' may receive a signal from CIRCUIT 2. Because the layered structure doesn't restrict the coupling between a plurality of them, the structures illustrated in FIG. 1 may, in general, be coupled in series, parallel or in backplane.

The fabrication of patterned structures for electronics/ organic electronics e.g. OPV, thin film-PV and OLEDs using a full coverage of thin film layer(s) together with printed busbar electrode enables a true design freedom. Below there are examples of components which may utilize the layered structure:

Organic/polymer light-emitting diodes OLED
Organic solar cells (organic photovoltaics) OSC/OPV
Perovskite solar cells
solar concentrator or the like
dye-sensitized solar cell (DSSC, DSC tai DYSC)
in a limited manner thin film-PV, which includes also other structures than OPV, perovskite cells and DSSC
Photo detectors (=photodiodes)
Light emitting cells, for example organic/polymer LEC/ LEEC.

The fabrication of custom-shaped 2D features with unlimited designs to any 2D shape using materials that are not visible to the registration camera and/or are challenging to print in patterns that have a high dimensional accuracy. Application areas may be custom-shape OPVs, custom-shape thin film PVs, custom-shape perovskites, custom-shape OLEDs or the like, for example.

Figure 3:
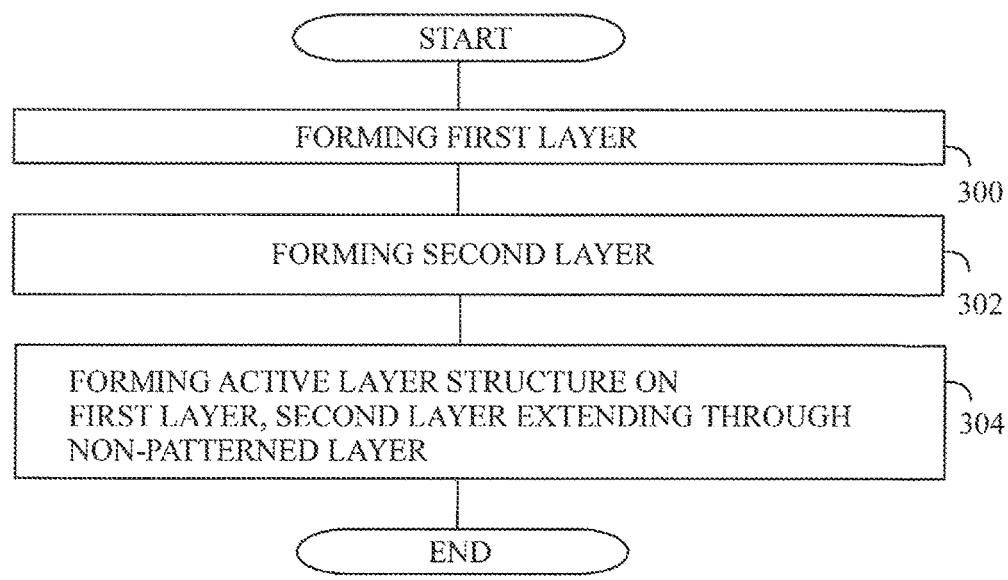
FIG. 3 illustrates of an example of a flow chart of a manufacturing method.

FIG. 3 is a flow chart of the measurement method. In step 300, a first patterned electrically conductive layer 102 is formed in contact with a layered structure 150 of a substrate 100. In step 302, a second patterned electrically conductive layer 104 is formed on and in contact with the first patterned electrically conductive layer 102. In step 304, an active layer structure 110A is formed on and in contact with the first electrically conductive layer 102 and the second patterned electrically conductive layer 104 which is thicker than the operationally active layer structure 110A in order to extend across the operationally active layer structure 110A.

The method allows using materials that are i) not visible to the registration camera, ii) that are challenging to print in patterns of high dimensional accuracy, and iii) that discharge static electricity through at least one conductive layer. This means that custom-shaped 2D features with unlimited designs to any 2D shape are possible which may provide true design freedom. Additionally, the use of this kind of processing method may be traced from the customized features enabling to protect these process phases. That is, the product can be visually distinguished from the prior art products.

It will be obvious to a person skilled in the art that, as technology advances, the inventive concept can be implemented in various ways. The invention and its embodiments are not limited to the example embodiments described above but may vary within the scope of the claims.

The invention claimed is:

1. A layered apparatus that comprises a substrate,
a first electrically conductive layer on and in contact with the substrate,
a second patterned electrically conductive layer which is in contact with the first electrically conductive layer,
a third electrically conductive layer,
a fourth electrically conductive layer which is electrically insulated from the first electrically conductive layer, the second patterned electrically conductive layer (104) and the third electrically conductive layer, wherein
an operationally active layer structure that is between the first electrically conductive layer and the fourth electrically conductive layer comprises at least one non-patterned layer; and the second patterned electrically conductive layer is configured to extend across the operationally active layer structure through the at least one non-patterned layer of operationally active layer structure for having an electrical contact with the third electrically conductive layer; and the second patterned electrically conductive layer is thicker than the operationally active layer structure, and a top part of the second patterned electrically conductive layer is configured to extend across the operationally active layer.

2. The apparatus of claim 1, wherein the active layer structure comprises a non-patterned electrically non-conducting layer and/or at least one interlayer, and the height variation at the top part of the second patterned electrically conductive layer is configured to be larger than the maximum thickness of at least one of the at least one interlayer, an active layer and/or the at least one non-patterned electrically non-conducting layer.

3. The apparatus of claim 2, characterized in wherein a maximum thickness of the second patterned electrically conductive layer is configured to range between 0.1 pm and 20 pm, a maximum thickness of the non-patterned electrically non-conducting layer is configured to range between 1 nm and 200 nm.

4. The apparatus of claim 1, wherein the interlayer of the operationally active layer structure is configured to have a lower electrical conductivity than the second patterned electrically conductive layer.

5. The apparatus of claim 1, characterized in that wherein the second patterned electrically conductive layer is printed or etched for having a desired height variation at the top part.

6. The apparatus of claim 1, characterized in that wherein the second patterned electrically conductive layer is configured penetrate each non-patterned layer.

7. The apparatus of claim 1, characterized in that wherein the active layer is configured to have a lower electrical conductivity than the second patterned electrically conductive layer.

8. The apparatus of claim 1, characterized in that wherein the fourth electrically conductive layer is configured to comprise at least one electrically conductive sublayer.

* * * * *